(12) United States Patent
Sawada et al.

(10) Patent No.: US 9,325,328 B2
(45) Date of Patent: Apr. 26, 2016

(54) OSCILLATION CIRCUIT, OSCILLATOR, ELECTRONIC APPARATUS, MOVING OBJECT, AND FREQUENCY ADJUSTMENT METHOD OF OSCILLATOR

(71) Applicant: Seiko Epson Corporation, Tokyo (JP)

(72) Inventors: Mitsuaki Sawada, Fujimi (JP); Yuichi Toriumi, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/580,943

(22) Filed: Dec. 23, 2014

(65) Prior Publication Data

US 2015/0188550 A1 Jul. 2, 2015

(30) Foreign Application Priority Data

Dec. 27, 2013 (JP) ................................. 2013-272733

(51) Int. Cl.
| | |
|---|---|
| H03L 7/06 | (2006.01) |
| H03L 7/08 | (2006.01) |
| H03B 5/32 | (2006.01) |
| H03B 5/36 | (2006.01) |
| H03L 7/099 | (2006.01) |

(52) U.S. Cl.
CPC .............. *H03L 7/0802* (2013.01); *H03B 5/326* (2013.01); *H03B 5/366* (2013.01); *H03L 7/08* (2013.01); *H03L 7/099* (2013.01); *H03B 2201/0208* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,154,095 A | 11/2000 | Shigemori et al. | |
| 6,522,871 B1* | 2/2003 | Patrick ...................... | H03J 7/04 |
| | | | 331/176 |
| 7,288,998 B2 | 10/2007 | Thomsen et al. | |
| 7,449,968 B1 | 11/2008 | Cioffi et al. | |
| 8,072,281 B2* | 12/2011 | Hanafi ..................... | H03B 5/04 |
| | | | 331/167 |
| 9,041,444 B1* | 5/2015 | Tarighat Mehrabani ..... | 327/157 |
| 2005/0110589 A1 | 5/2005 | Loke et al. | |
| 2006/0056561 A1* | 3/2006 | Zhang ..................... | H03L 7/087 |
| | | | 375/376 |
| 2006/0139103 A1* | 6/2006 | Beeson .................... | H03L 7/081 |
| | | | 331/16 |
| 2007/0296510 A1 | 12/2007 | Backes | |

(Continued)

FOREIGN PATENT DOCUMENTS

| | | |
|---|---|---|
| EP | 0655829 A1 | 5/1995 |
| JP | 2002-519924 A | 7/2002 |

(Continued)

OTHER PUBLICATIONS

Partial Search Report for European Patent Applicaiton No. 14199639.7 dated May 6, 2015 (7 pages).

*Primary Examiner* — Adam Houston
(74) *Attorney, Agent, or Firm* — Harness, Dickey & Pierce, P.L.C.

(57) ABSTRACT

An oscillation circuit includes a voltage controlled oscillation circuit that includes a variable capacitance circuit provided with a variable capacitance element whose capacitance value is controlled on the basis of a control voltage and oscillates a vibrator so as to generate an oscillation signal, and a fractional N-PLL circuit that receives the oscillation signal generated by the voltage controlled oscillation circuit and includes a voltage controlled oscillator which controls an oscillation frequency on the basis of control input data (an integral division ratio and a fractional division ratio).

14 Claims, 12 Drawing Sheets

(56) References Cited

U.S. PATENT DOCUMENTS

| | | | |
|---|---|---|---|
| 2008/0204157 A1 | 8/2008 | Tsukizawa et al. | |
| 2009/0072875 A1 | 3/2009 | Tarng et al. | |
| 2010/0277360 A1* | 11/2010 | Lee | G01S 5/0289 342/125 |
| 2011/0149464 A1 | 6/2011 | Takahashi | |
| 2014/0091843 A1* | 4/2014 | Upadhyaya | H04L 27/0014 327/157 |
| 2014/0241467 A1* | 8/2014 | Huang | H03L 7/00 375/327 |
| 2015/0065043 A1* | 3/2015 | Heng | H04B 5/0031 455/41.1 |
| 2015/0229317 A1* | 8/2015 | Juneau | H03L 7/18 327/105 |

FOREIGN PATENT DOCUMENTS

| | | |
|---|---|---|
| JP | 2006-217509 A | 8/2006 |
| JP | 2006-526946 A | 11/2006 |
| JP | 2008-245259 A | 10/2008 |
| JP | 2010-278718 A | 12/2010 |
| JP | 2012-064915 A | 3/2012 |
| WO | WO-00-01072 A1 | 1/2000 |
| WO | WO-02-01722 A1 | 1/2002 |
| WO | WO-2004-100380 A1 | 11/2004 |

* cited by examiner

| REFERENCE FREQUENCY [MHz] | MAGNIFICATION | FREQUENCY [MHz] |
|---|---|---|
| 100.0075 | 4.000 | 400.03000 (a) |
|  | 3.9997 | 400.00000 (b) |
| INTEGER BOUNDARY SPUR(IBS)=(b)-(a) | | 0.0300 |

FIG. 9A

| REFERENCE FREQUENCY [MHz] | MAGNIFICATION | FREQUENCY [MHz] |
|---|---|---|
| 100.0075 | 4.000 | 400.03000 (a) |
|  | 3.9999 | 400.02000 (b) |
| INTEGER BOUNDARY SPUR(IBS)=(b)-(a) | | 0.0100 |

FIG. 9B

| REFERENCE FREQUENCY [MHz] | MAGNIFICATION | FREQUENCY [MHz] |
|---|---|---|
| 100.0075 | 4.000 | 400.03000 (a) |
| | 3.9997 | 400.00000 (b) |
| INTEGER BOUNDARY SPUR(IBS)=(b)-(a) | | 0.0300 |

FIG. 11A

| REFERENCE FREQUENCY [MHz] | MAGNIFICATION | FREQUENCY [MHz] |
|---|---|---|
| 100.0125 | 4.000 | 400.05000 (a) |
| | 3.9999 | 400.02000 (b) |
| INTEGER BOUNDARY SPUR(IBS)=(b)-(a) | | 0.0300015 |

FIG. 11B

OSCILLATION CIRCUIT, OSCILLATOR, ELECTRONIC APPARATUS, MOVING OBJECT, AND FREQUENCY ADJUSTMENT METHOD OF OSCILLATOR

BACKGROUND

1. Technical Field

The present invention relates to an oscillation circuit, an oscillator, an electronic apparatus, a moving object, and a frequency adjustment method of the oscillator.

2. Related Art

There is an ever increasing demand for an oscillator which can change a frequency output from an external terminal in a desired range in fields such as optical communications. As such an oscillator, there are known oscillators such as an analog type voltage controlled oscillator (for example, a voltage controlled crystal oscillator (VCXO)) in which a capacitance value of a load capacitor of an oscillation circuit changes depending on a control voltage which is applied to an external terminal and thus an output frequency changes, or a digital type oscillator in which a fractional N-PLL circuit is connected to a rear stage of a simple packaged crystal oscillator (SPXO), and an output frequency changes by changing a setting of the fractional N-PLL circuit from an external terminal.

An analog type oscillator is disclosed in, for example, JP-A-2012-64915. In the oscillator disclosed in JP-A-2012-64915, a plurality of circuits are provided and are connected in parallel to each other so as to be used as a load capacitance circuit of a quartz crystal vibrator. Each of the circuits includes a variable capacitance element whose capacitance value is controlled by a voltage and a capacitor connected in series with each other. As a result, an output frequency is variably controlled.

A digital type oscillator is disclosed in, for example, JP-T-2006-526946. In the oscillator disclosed in JP-T-2006-526946, a control voltage VC is converted into a digital value by an analog-digital converter (ADC), and a division ratio of a fractional N-PLL circuit is controlled according to the digital value so that an output frequency is variably controlled.

However, in the oscillator disclosed in JP-A-2012-64915, there are problems in that, in a case where a central frequency (an output frequency when a control voltage is a central voltage in a variable range) is changed, the quartz crystal vibrator is required to be changed, electrical correction such as changing setting data cannot be performed on the central frequency, and a limitation is put on a variable range of an output frequency.

In the oscillator disclosed in JP-T-2006-526946, since an operation speed of the ADC is limited, it is difficult to change an output frequency at a high speed (to increase an upper limit of a modulation bandwidth), and if the ADC is operated at a high speed, there is a concern that digital noise or power consumption may increase.

SUMMARY

An advantage of some aspects of the invention is to provide an oscillation circuit and an oscillator which can electrically correct a central frequency, can change an output frequency at a high speed, and can easily extend a variable range of the output frequency. Another advantage of some aspects of the invention is to provide an electronic apparatus and a moving object with high reliability, using the oscillation circuit or the oscillator.

The invention can be implemented as the following forms or application examples.

Application Example 1

An oscillation circuit according to this application example includes a voltage controlled oscillation circuit that includes a variable capacitance circuit provided with a variable capacitance element whose capacitance value is controlled on the basis of an input voltage and oscillates the vibrator so as to generate an oscillation signal; and a PLL circuit that receives the oscillation signal and includes an oscillation portion which controls an oscillation frequency on the basis of control input data.

The voltage controlled oscillation circuit may be part of each of various oscillation circuits such as a Pierce oscillator circuit, an inverter type oscillation circuit, a Colpitts oscillator, and a Hartley oscillator circuit.

According to the oscillation circuit of this application example, since a frequency of the oscillation signal which is output from the voltage controlled oscillation circuit can be adjusted by the PLL circuit which is provided in the rear stage of the voltage controlled oscillation circuit, it is possible to correct a central frequency without physically processing a quartz crystal vibrator.

According to the oscillation circuit of this application example, since an oscillation frequency of the voltage controlled oscillation circuit is changed in tracking of a change of the input voltage, for example, if the input voltage is changed at a high speed without changing setting of the PLL circuit, it is possible to change an output frequency at a high speed. Alternatively, if setting of the PLL circuit can be changed via a digital interface (the setting can be changed without performing analog-digital conversion), a frequency of the oscillation signal output from the PLL circuit can be changed at a high speed, and thus it is possible to change an output frequency at a high speed.

In the oscillation circuit according to this application example, the variable capacitance circuit may include a switch circuit which exclusively selects the input voltage and a fixed voltage so as to apply a selected voltage to the variable capacitance element. For example, if the plurality of variable capacitance elements and the plurality of switch circuits are provided in the variable capacitance circuit, it is possible to easily change a variable range of a capacitance value (a combined capacitance value of the plurality of variable capacitance elements) of the variable capacitance circuit according to a voltage which is selected by the switch circuit for each variable capacitance element. Consequently, it is possible to easily change a variable range (frequency variable sensitivity) of an output frequency of the oscillation circuit. In addition, since the linearity of the combined capacitance value is maintained, that is, a combined capacitance value of the variable capacitance circuit is constant when the input voltage is the same as the fixed voltage, regardless of the number of variable capacitance elements, it is possible to widen a frequency variable range while ensuring the linearity of an output frequency change of the oscillation circuit by increasing the number of variable capacitance elements.

Application Example 2

In the oscillation circuit according to the application example described above, the PLL circuit may be a fractional N-PLL circuit.

According to the oscillation circuit of this application example, a rough adjustment of an output frequency may be performed by the voltage controlled oscillation circuit, and a fine adjustment of the output frequency may be performed by the fractional N-PLL circuit which can perform fractional multiplication. Alternatively, a rough adjustment of an output frequency may be performed by the fractional N-PLL circuit, and a fine adjustment of the output frequency may be performed by the voltage controlled oscillation circuit.

According to the oscillation circuit of this application example, in a case where an output frequency is changed by changing an oscillation frequency of the voltage controlled oscillation circuit through changing of the input voltage without changing setting of the fractional N-PLL circuit, the setting of the fractional N-PLL circuit is not changed. Thus, it is possible to reduce fluctuation in a frequency at which an integer boundary spur occurs.

Application Example 3

In the oscillation circuit according to the application example described above, the oscillation signal may a signal with amplitude smaller than amplitude of a power supply voltage which is supplied to the oscillation circuit.

According to the oscillation circuit of this application example, since the oscillation signal output from the voltage controlled oscillation circuit has the small amplitude, it is possible to reduce energy required for transmission and reception of the oscillation signal between the voltage controlled oscillation circuit and the PLL circuit and thus to reduce a noise level mixed into the oscillation portion of the PLL circuit. Therefore, it is possible to reduce phase noise or jitter of the oscillation signal which is output from the oscillation portion of the PLL circuit.

Application Example 4

In the oscillation circuit according to the application example described above, power supply voltages may be supplied to the voltage controlled oscillation circuit and the oscillation portion of the PLL circuit from different power supplies.

According to the oscillation circuit of this application example, a power supply of the voltage controlled oscillation circuit is separated from a power supply of the oscillation portion of the PLL circuit. Therefore, since a fluctuation of the power supply voltage of the voltage controlled oscillation circuit, occurring when the input voltage is changed, is not superimposed on the power supply voltage of the oscillation portion of the PLL circuit, it is possible to reduce superimposition of noise on the oscillation signal which is output from the oscillation portion of the PLL circuit. Therefore, it is possible to reduce phase noise or jitter of the oscillation signal which is output from the oscillation portion of the PLL circuit.

Application Example 5

An oscillator according to this application example includes any one of the oscillation circuits described above; and a vibrator.

According to the oscillator of this application example, the oscillator includes any one of the oscillation circuits, and thus it is possible to correct a central frequency, to change an output frequency at a high speed, and to easily extend a variable range of the output frequency.

Application Example 6

An electronic apparatus according to this application example includes any one of the oscillation circuits described above.

Application Example 7

A moving object according to this application example includes any one of the oscillation circuits described above.

According to the electronic apparatus and the moving object of these application examples, since the electronic apparatus and the moving object include the oscillation circuit which can correct a central frequency, can change an output frequency at a high speed, and can easily extend a variable range of the output frequency, it is possible to realize high practicality.

Application Example 8

A frequency adjustment method of an oscillator according to this application example is a frequency adjustment method of an oscillator which includes a vibrator; a voltage controlled oscillation circuit that includes a variable capacitance circuit provided with a variable capacitance element whose capacitance value is controlled on the basis of an input voltage and oscillates the vibrator so as to generate an oscillation signal; and a PLL circuit that receives the oscillation signal and includes an oscillation portion which controls an oscillation frequency on the basis of control input data, the method including adjusting a frequency of the oscillation signal by changing setting of the PLL circuit; and changing a capacitance value of the variable capacitance element by changing the input voltage without changing the setting of the PLL circuit, and thus adjusting a frequency of the oscillation circuit.

According to the frequency adjustment method of the oscillator of this application example, a frequency of the oscillation signal which is output from the voltage controlled oscillation circuit is adjusted by the PLL circuit, and thus a central frequency can be corrected. An output frequency can be changed at a high speed by changing the input voltage at a high speed without changing setting of the PLL circuit.

According to the frequency adjustment method of the oscillator of this application example, since an output frequency is changed by changing an oscillation frequency of the voltage controlled oscillation circuit through changing of the input voltage without changing setting of the PLL circuit, for example, even if a fractional N-PLL circuit is used as the PLL circuit, it is possible to reduce a fluctuation in a frequency at which an integer boundary spur occurs.

Application Example 9

In the frequency adjustment method of the oscillator according to the application example described above, the setting of the PLL circuit may be setting regarding an integral division ratio and a fractional division ratio.

BRIEF DESCRIPTION OF THE DRAWINGS

Embodiments of the invention will be described with reference to the accompanying drawings, wherein like numbers reference like elements.

FIGS. 9A and 9B are diagrams illustrating that a frequency changes at which an integer boundary spur occurs in a case where an output frequency is changed in an oscillator of the related art.

FIGS. 11A and 11B are diagrams illustrating that a frequency scarcely changes at which an integer boundary spur occurs in a case where an output frequency is changed in an oscillator of the present embodiment.

DESCRIPTION OF EXEMPLARY EMBODIMENTS

Hereinafter, a preferred embodiment of the invention will be described with reference to the drawings. The embodiment described below does not improperly limit the content of the invention recited in the appended claims. Not all of the configurations described below are essential constituent requirements.

1. Oscillator

Configuration of Oscillator

Figure 1:
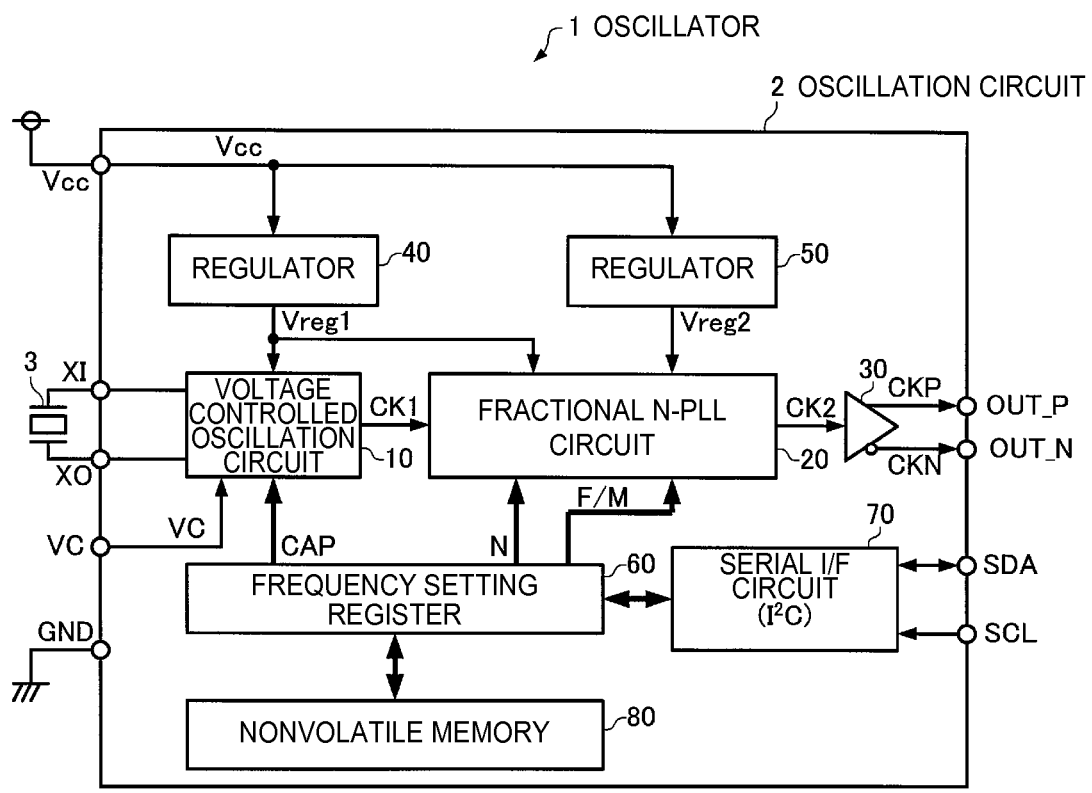
FIG. 1 is a configuration diagram of an oscillator of the present embodiment.

FIG. 1 is a configuration diagram of an oscillator of the present embodiment. As illustrated in FIG. 1, an oscillator 1 of the present embodiment includes an oscillation circuit 2 and a vibrator 3. The oscillation circuit 2 and the vibrator 3 are stored in a package (not illustrated).

In the present embodiment, the vibrator 3 is a quartz crystal vibrator in which quartz crystal is used as a substrate material, and, for example, an AT cut or SC cut quartz crystal resonator is used. The vibrator 3 may be a surface acoustic wave (SAW) resonator or a micro-electro-mechanical system (MEMS) vibrator. As a substrate material of the vibrator 3, not only the quartz crystal but also a piezoelectric single crystal such as lithium tantalite or lithium niobate, a piezoelectric material such as piezoelectric ceramics, for example, lead zirconate titanate, a silicon semiconductor material, or the like may be used. As a method for exciting the vibrator 3, a method using a piezoelectric effect may be used, and electrostatic driving using a coulomb force may be used.

The oscillation circuit 2 is provided with a Vcc terminal which is a power supply terminal, a GND terminal which is a ground terminal, an OUT_P terminal and an OUT_N terminal which are differential output terminals, a VC terminal for frequency control, an SDA terminal and an SCL terminal for external interface, and an XI terminal and an XO terminal which are connection terminals with the vibrator 3. The Vcc terminal, the GND terminal, the OUT_P terminal and the OUT_N terminal, and the SDA terminal and the SCL terminal are also connected to external terminals (not illustrated) of the oscillator 1.

In the present embodiment, the oscillation circuit 2 includes a voltage controlled oscillation circuit 10, a fractional N-PLL circuit 20, an output circuit 30, a regulator 40, a regulator 50, a frequency setting register 60, a serial interface (I/F) circuit 70, and a nonvolatile memory 80. The oscillation circuit 2 of the present embodiment may have a configuration in which some of the constituent elements may be omitted or changed, or other elements may be added thereto.

The voltage controlled oscillation circuit 10 is a circuit for oscillating the vibrator 3, and amplifies an output signal of the vibrator 3 so as to feed back the output signal to the vibrator 3. The voltage controlled oscillation circuit 10 outputs an oscillation signal CK1 based on oscillation of the vibrator 3. A frequency of the oscillation signal CK1 changes according to a control voltage VC which is input from the VC terminal. In the present embodiment, capacitance selection data CAP for selecting a capacitance value of a variable capacitance circuit included in the voltage controlled oscillation circuit 10 is stored in the nonvolatile memory 80, and is set via the frequency setting register 60. A variable range of an oscillation frequency of the voltage controlled oscillation circuit 10 is selectable on the basis of a set value of the capacitance selection data CAP.

The fractional N-PLL circuit 20 generates an oscillation signal CK2 obtained by multiplying a frequency (reference frequency) of the oscillation signal CK1 on the basis of an integral division ratio N and a fractional division ratio F/M which are control input data which is input from the frequency setting register 60. Here, a relationship of the following Equation (1) is established between a frequency f1 of the oscillation signal CK1 and a frequency f2 of the oscillation signal CK2.

$$f2 = \left(N + \frac{F}{M}\right) \times f1 \quad (1)$$

The output circuit 30 converts the oscillation signal CK2 which is output from the fractional N-PLL circuit 20, into differential signals formed by a non-inverted signal CKP and an inverted signal CKN. The non-inverted signal CKP is output from the output terminal OUT_P to an external device, and the inverted signal CKN is output from the output terminal OUT_N to the external device. The output circuit 30 may be, for example, a differential output circuit such as a low voltage differential signaling (LVDS) circuit, a positive emitter coupled logic (PECL) circuit, or a low voltage PECL (LVPECL) circuit. However, the output circuit 30 may be a single-end output circuit.

The regulator 40 generates a constant voltage Vreg1 which is lower than a power supply voltage Vcc on the basis of the power supply voltage Vcc supplied from the Vcc terminal. The constant voltage Vreg1 is supplied as a power supply voltage of the voltage controlled oscillation circuit 10 and a power supply voltage of some circuits of the fractional N-PLL circuit 20.

The regulator 50 generates a constant voltage Vreg2 which is lower than the power supply voltage Vcc on the basis of the power supply voltage Vcc supplied from the Vcc terminal. The constant voltage Vreg2 is supplied as a power supply voltage of some circuits of the fractional N-PLL circuit 20.

In the present embodiment, the constant voltage Vreg1 and the constant voltage Vreg2 are the same voltage, but the constant voltage Vreg1 and the constant voltage Vreg2 may be different from each other unless operation errors occur in interface portions between the circuits having the constant voltage Vreg1 as a power supply voltage and the circuits having the constant voltage Vreg2 as a power supply voltage.

In the present embodiment, the serial interface circuit 70 is an I2C standard digital interface circuit. A serial data signal is input to and output from the serial interface circuit 70 from and to the SDA terminal, and a clock signal is input thereto from the SCL terminal. An external device can perform a reading operation and/or a writing operation on a register (not illustrated) for setting the integral division ratio N in the frequency setting register 60 or a register (not illustrated) for setting the fractional division ratio F/M therein, or the non-volatile memory 80, via the SDA terminal, the SCL terminal, and the serial interface circuit 70. It is possible to change the integral division ratio N and the fractional division ratio F/M of the fractional N-PLL circuit 20 at a high speed via the serial interface circuit 70.

The serial interface circuit 70 may be interface circuits with communication standards other than I2C. The oscillation circuit 2 may be a one-chip semiconductor integrated circuit (IC), may be formed by a plurality of IC chips, and may be partially formed by discrete components.

Configuration of Voltage Controlled Oscillation Circuit

Figure 2:
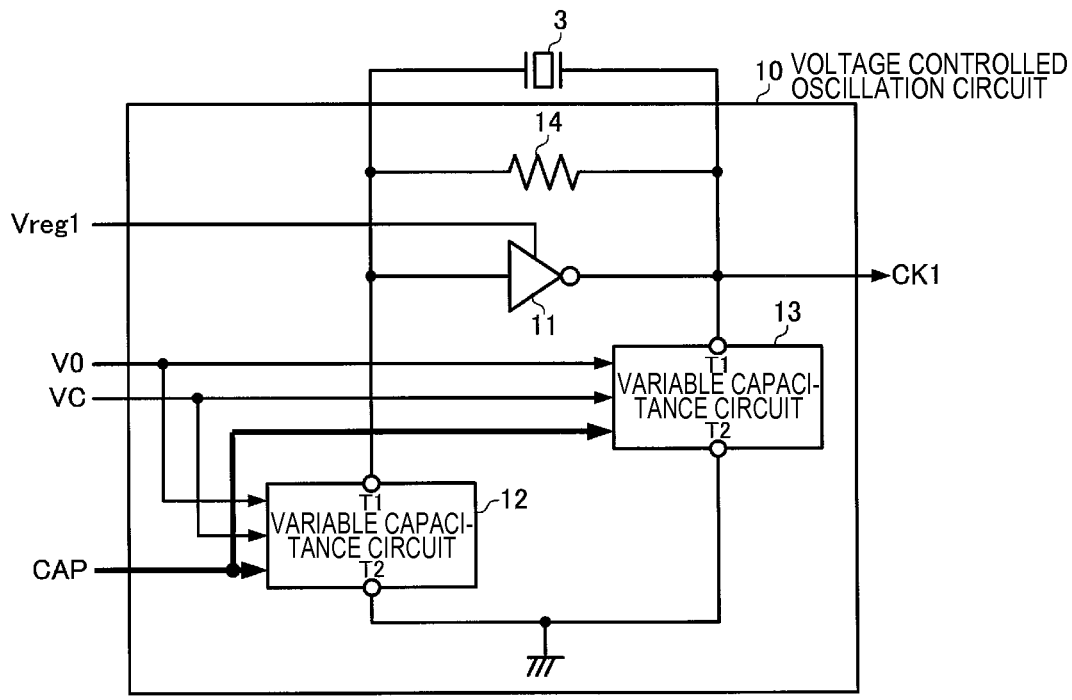
FIG. 2 is a diagram illustrating a configuration example of a voltage controlled oscillation circuit.

FIG. 2 is a diagram illustrating a configuration example of the voltage controlled oscillation circuit 10 of FIG. 1. As illustrated in FIG. 2, the voltage controlled oscillation circuit 10 includes an inverter circuit 11, two variable capacitance circuits 12 and 13, and a feedback resistor 14.

The inverter circuit 11 and the feedback resistor 14 are connected in parallel to the vibrator 3.

The variable capacitance circuit 12 is connected between an input terminal of the inverter circuit 11 and a ground, and the variable capacitance circuit 13 is connected between an output terminal of the inverter circuit 11 and the ground.

The inverter circuit 11 is supplied with the voltage Vreg1 generated by the regulator 40 as a power supply voltage, and generates the oscillation signal CK1 by oscillating the vibrator 3 with the variable capacitance circuits 12 and 13 as load capacitors. A frequency of the oscillation signal CK1 is determined in accordance with a resonance frequency of the vibrator 3 and a capacitance value of each of the variable capacitance circuits 12 and 13.

Figure 3:
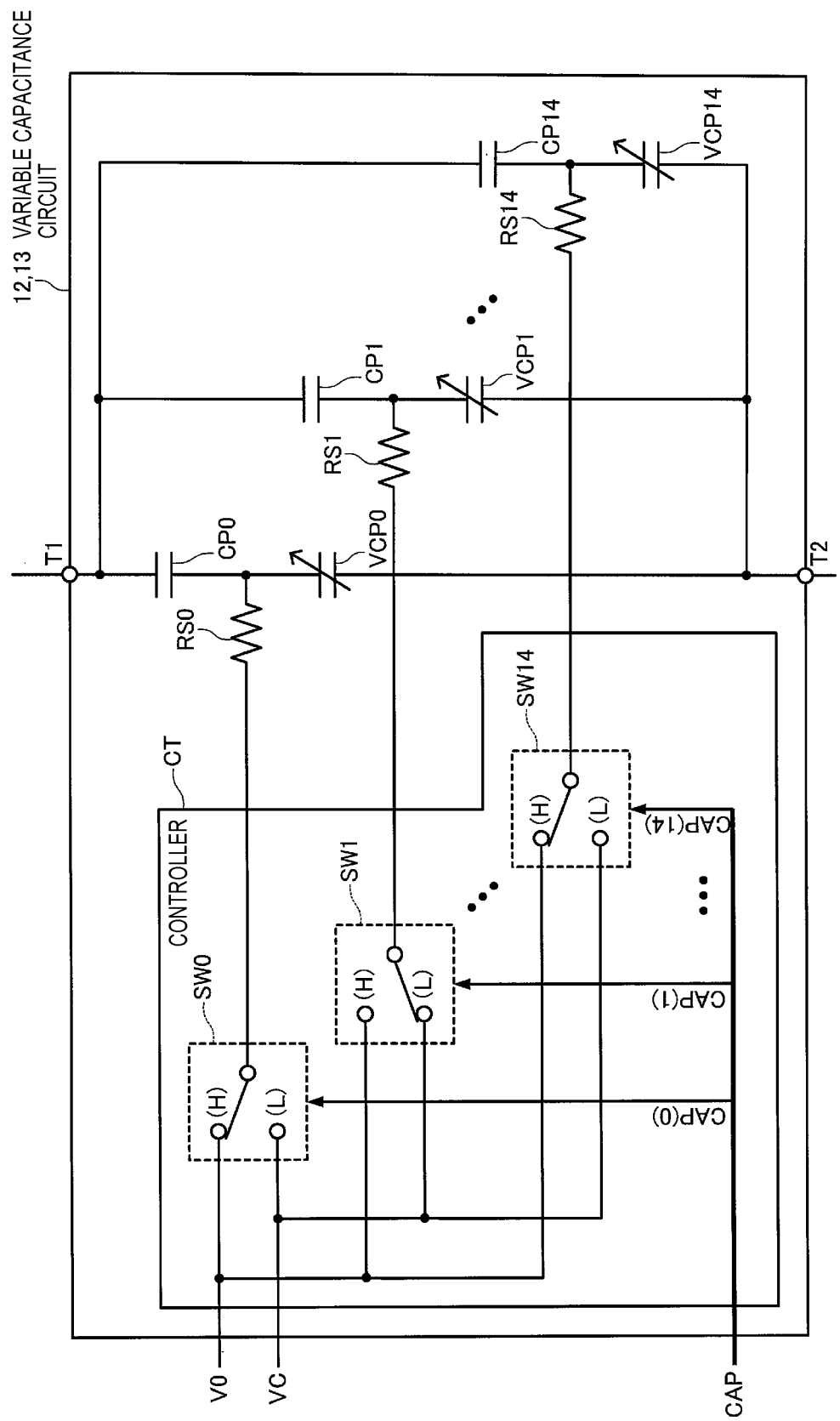
FIG. 3 is a diagram illustrating a configuration example of a variable capacitance circuit.

FIG. 3 is a diagram illustrating a configuration example of each of the variable capacitance circuits 12 and 13. Each of the variable capacitance circuits 12 and 13 includes N (where N is an integer of 2 or more, and, in FIG. 3, N=15) variable capacitors VCP0, VCP1, ..., and VCP14 (an example of variable capacitance elements), N fixed capacitors CP0, CP1, ..., and CP14, N resistors RS0, RS1, ..., and RS14, and a controller CT.

First terminals of the fixed capacitors CP0 to CP14 are connected in common to a terminal T1, and second terminals thereof are respectively connected to first ends of the variable capacitors VCP0 to VCP14.

The first terminals of the variable capacitors VCP0 to VCP14 are respectively connected the second terminals of the fixed capacitors CP0 to CP14, and second terminals thereof are connected in common to a terminal T2.

As illustrated in FIG. 2, the terminal T1 of the variable capacitance circuit 12 is connected to the input terminal of the inverter circuit 11, and the terminal T1 of the variable capacitance circuit 13 is connected to the output terminal of the inverter circuit 11. The terminal T2 of the variable capacitance circuit 12 and a terminal T2 of the variable capacitance circuit 13 are grounded together.

The controller CT includes N switches SW0 to SW14. A fixed voltage V0 is input to each of first input terminals of the switches SW0 to SW14 (an example of the switch circuit), and the control voltage VC is input to each of second input terminals thereof. Output terminals of the switches SW0 to SW14 are respectively connected to the first terminals of the variable capacitors VCP0 to VCP14 via the resistors RS0 to RS14.

When the minimum voltage and the maximum voltage of the control voltage VC are respectively set to VCmin and VCmax, the fixed voltage V0 is fixed to a certain voltage which is equal to or higher than VCmin and equal to or lower than VCmax. In the present embodiment, the fixed voltage V0 is a voltage which is exactly intermediate between the minimum value VCmin and the maximum value VCmax of the control voltage VC, that is, (VCmin+VCmax)/2. For example, when the minimum value VCmin is 0V and the maximum value VCmax is the power supply voltage Vcc supplied from an external device, the fixed voltage V0 becomes Vcc/2. The fixed voltage V0 may be generated by the regulator 40 illustrated in FIG. 1, and may be generated by a voltage generation circuit (not illustrated).

A high level or low level control signal is input to each of control terminals of the switches SW0 to SW14 according to respective bits CAP(0) to CAP(14) of the N-bit capacitance selection data CAP. If a high level control signal is input thereto, the first input terminal is connected to the output terminal, and if a low level control signal is input thereto, the second input terminal is connected to the output terminal. However, in the switches SW0 to SW14, if a high level control signal is input thereto, the second input terminal may be connected to the output terminal, and if a low level control signal is input thereto, the first input terminal may be connected to the output terminal.

Therefore, among the switches SW0 to SW14, the fixed voltage V0 is applied to the first terminal of the variable capacitor which is connected to the output terminal of the switch to which a high level control signal is input, and the control voltage VC is applied to the first terminal of the variable capacitor which is connected to the output terminal of the switch to which a low level control signal is input. As a result, for example, the variable capacitors to which the fixed voltage V0 is applied via the switches SW0 and SW14 of FIG. 3 have a fixed capacitance value without being influenced by the control voltage VC, and the variable capacitor to which the control voltage VC is applied via the switch SW1 of FIG. 3 has a variable capacitance value depending on the control voltage VC.

Figure 4A:
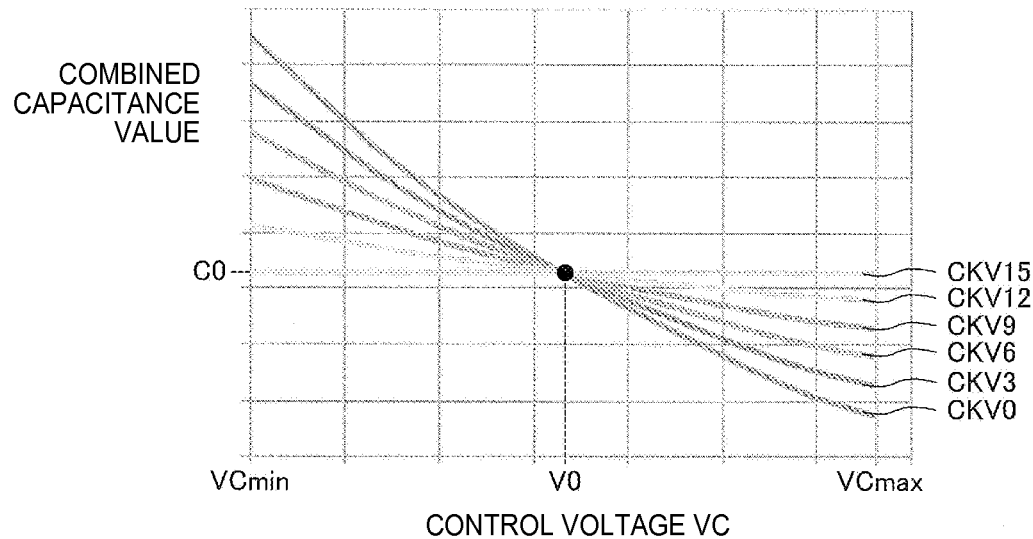
FIGS. 4A and 4B are diagrams illustrating a relationship between a control voltage VC and a combined capacitance value of the variable capacitance circuit.

FIG. 4A is a diagram illustrating a relationship between the control voltage VC and a combined capacitance value of the variable capacitance circuit 12 (or the variable capacitance circuit 13). In FIG. 4A, the horizontal axis expresses the control voltage VC, and the vertical axis expresses a combined capacitance value (a combined capacitance value of the variable capacitors VCP0 to VCP14) of the variable capacitance circuit 12 (or the variable capacitance circuit 13). Six characteristic curves (voltage-combined capacitance value characteristic) CKVn (where n=0, 3, 6, 9, 12, and 15) illustrated in FIG. 4A are characteristic curves in a case where the fixed voltage V0 is applied to n variable capacitors of the fifteen variable capacitors VCP0 to VCP14.

The curve CKV15 is a characteristic curve in a case where the fixed voltage V0 is applied to all the variable capacitors VCP0 to VCP14, and a combined capacitance value is fixed to a capacitance value C0 without being influenced by the control voltage VC. The curves CKV3, CKV6, CKV9 and CKV12 are respectively characteristic curves in a case where the fixed voltage V0 is applied to three, six, eight and twelve variable capacitors. Here, when the control voltage VC is the same as the fixed voltage V0, a combined capacitance value becomes the capacitance value C0, and the smaller the number of variable capacitors to which the fixed voltage V0 is applied, the wider the variable range of a combined capacitance value caused by the control voltage VC. The curve CKV0 is a characteristic curve in a case where the control voltage VC is applied to all the variable capacitors VCP0 to VCP14. In this curve, when the control voltage VC is the same as the fixed voltage V0, a combined capacitance value becomes the capacitance value C0, and a variable range of a combined capacitance value caused by the control voltage VC is widest.

For convenience of illustration, CKVn (where n=1, 2, 4, 5, 7, 8, 10, 11, 13, and 14) are not illustrated in FIG. 3, but, also in these characteristic curves, when the control voltage VC is the same as the fixed voltage V0, a combined capacitance value becomes the capacitance value C0, and a combined capacitance value is varied by the control voltage VC.

Figure 4B:
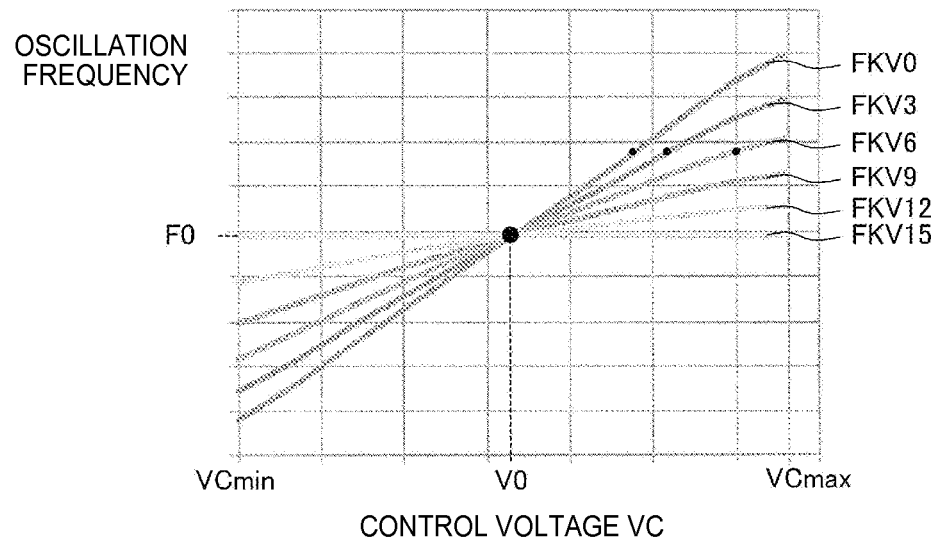

FIG. 4B is a diagram illustrating a relationship between the control voltage VC and an oscillation frequency of the voltage controlled oscillation circuit 10. In FIG. 4B, the horizontal axis expresses the control voltage VC, and the vertical axis expresses an oscillation frequency (a frequency of the oscillation signal CK1) of the voltage controlled oscillation circuit 10. Six characteristic curves (voltage-frequency characteristic) FKVn (where n=0, 3, 6, 9, 12, and 15) illustrated in FIG. 4B are characteristic curves in a case where the fixed voltage V0 is applied to n variable capacitors of the fifteen variable capacitors VCP0 to VCP14, and respectively correspond to the cases where a combined capacitance value of the variable capacitors VCP0 to VCP14 is the characteristic curve (voltage-combined capacitance value) CKVn of FIG. 4A.

In the curve FKV15, an oscillation frequency is fixed to a frequency F0 without being influenced by the control voltage VC. In the curves FKV3, FKV6, FKV9 and FKV12, when the control voltage VC is the same as the fixed voltage V0, an oscillation frequency becomes the frequency F0, and the smaller the number of variable capacitors to which the fixed voltage V0 is applied, the wider the variable range of an oscillation frequency caused by the control voltage VC. In the curve FKV0, when the control voltage VC is the same as the fixed voltage V0, an oscillation frequency becomes the frequency F0, and a variable range of an oscillation frequency caused by the control voltage VC is widest.

As mentioned above, in the present embodiment, the voltage controlled oscillation circuit 10 includes the variable capacitance circuits 12 and 13, and thus it is possible to easily change a frequency variable range (frequency variable sensitivity) relative to a change in the control voltage VC on the basis of a set value of the capacitance selection data CAP. Therefore, variations in frequency variable ranges of the voltage controlled oscillation circuits 10 of the oscillators 1 are adjusted, and thus a constant variable range can be obtained.

Since a combined capacitance value becomes constant in the variable capacitance circuits 12 and 13 when the control voltage VC is the fixed voltage V0 regardless of the number of variable capacitors, and the linearity of the combined capacitance value is maintained, it is possible to widen a frequency variable range while ensuring the linearity of an oscillation frequency change of the voltage controlled oscillation circuit 10 relative to a change in the control voltage VC by increasing the number of variable capacitors.

Although, in the variable capacitance circuits 12 and 13 of the present embodiment, the variable capacitors VCP0, VCP2, . . . , and VCP14 are constituted by using the same type capacitors (whose both central values of capacitance values and variable ranges are the same as each other), some or all of the variable capacitors may be constituted by using capacitors whose central values of capacitance values or variable ranges are different from each other. In addition, in the present embodiment, the variable capacitance circuit 12 and the variable capacitance circuit 13 have the same configuration as each other, but may have configurations different from each other as a result of making the number of variable capacitance elements different. The voltage controlled oscillation circuit 10 may have a configuration in which either one of the variable capacitance circuits 12 and 13 is omitted.

Configuration of Fractional N-PLL Circuit

Figure 5:
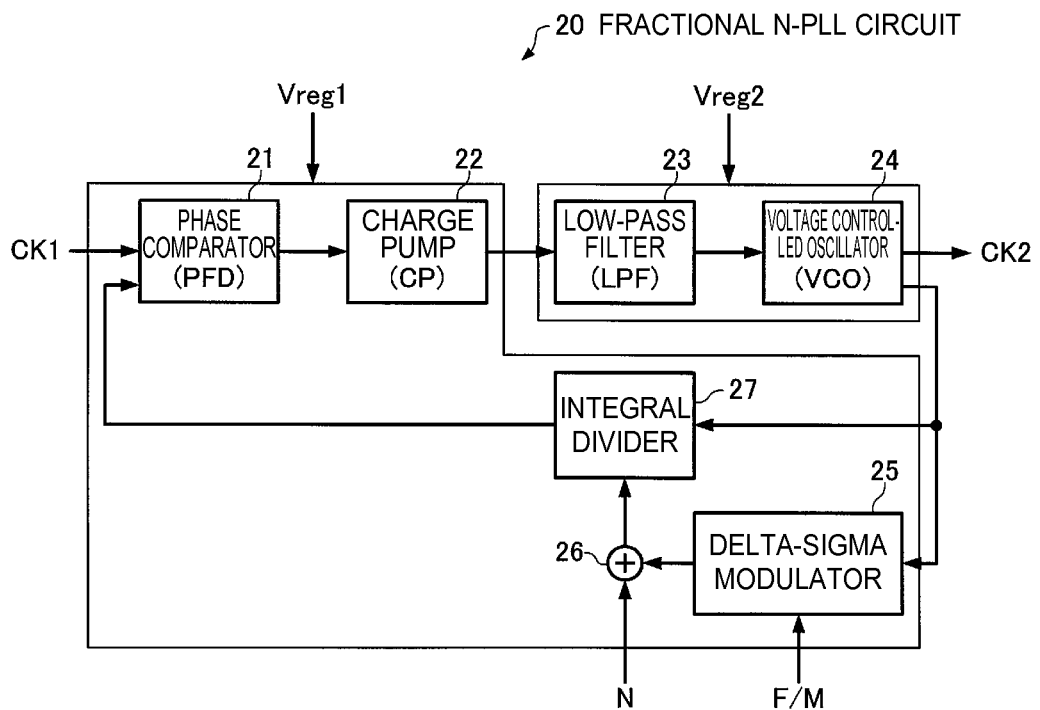
FIG. 5 is a diagram illustrating a configuration example of a fractional N-PLL circuit.

FIG. 5 is a diagram illustrating a configuration example of the fractional N-PLL circuit 20 of FIG. 1. As illustrated in FIG. 5, the fractional N-PLL circuit 20 includes a phase comparator (phase frequency detector; PFD) 21, a charge pump (CP) 22, a low-pass filter (LPF) 23, a voltage controlled oscillator (VCO) 24, a delta-sigma modulator 25, an adder 26, and an integral divider 27.

The phase comparator 21 compares a phase of the oscillation signal CK1 which is output from the voltage controlled oscillation circuit 10 and a phase of an output signal from the integral divider 27, and outputs a phase difference obtained as a result of the comparison, as a pulse voltage.

The charge pump 22 converts the pulse voltage which is output from the phase comparator 21 into a current, and the low-pass filter 23 smoothes and converts the current which is output from the charge pump 22, into a voltage.

The voltage controlled oscillator 24 (an example of an oscillation portion) outputs the oscillation signal CK2 whose oscillation frequency changes depending on an output voltage from the low-pass filter 23.

The delta-sigma modulator 25 integrates the fractional division ratio F/M and outputs a signal obtained by quantizing the fractional division ratio F/M.

The adder 26 outputs a signal (N or N+1) obtained by adding an output signal (0 or 1) from the delta-sigma modulator 25 to the integral division ratio N.

The integral divider 27 outputs a signal obtained by dividing the oscillation signal CK2 by using the output signal (N or N+1) from the adder 26 as a division ratio.

The fractional N-PLL circuit 20 modulates an output signal from the integral divider 27 according to an output signal from the delta-sigma modulator 25 so as to realize average fractional division, and thus outputs the oscillation signal CK2 with a frequency (output frequency) f2 which is obtained by multiplying a frequency (reference frequency) f1 of the oscillation signal CK1 by the fraction (N+F/M), as shown in Equation (1).

Examination for Reducing Increase in Phase Noise

Figure 6:
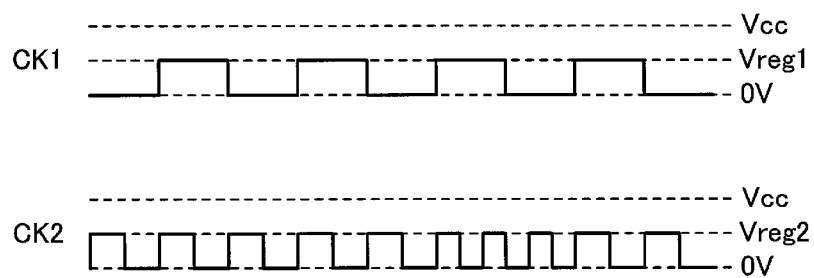
FIG. 6 is a waveform diagram of an oscillation signal.

In the present embodiment, in the same manner as in the voltage controlled oscillation circuit 10, the constant voltage Vreg1 is supplied to the phase comparator 21, the charge pump 22, the delta-sigma modulator 25, the adder 26, and the integral divider 27 as a power supply voltage, and the constant voltage Vreg2 which is different from the constant voltage Vreg1 is supplied to the low-pass filter 23 and the voltage controlled oscillator 24 as a power supply voltage. Therefore, as illustrated in FIG. 6, whereas a high level of the oscillation signal CK1 is the voltage Vreg1, and a high level of the oscillation signal CK2 is the voltage Vreg2. As mentioned above, a power supply of a circuit which is operated at a reference frequency is separated from a power supply of a circuit which is operated at an output frequency. Therefore, since a voltage fluctuation of the voltage Vreg1 having noise at the reference frequency is not superimposed on the voltage Vreg2 which is operated at the output frequency, it is possible to reduce superimposition of noise on the oscillation signal CK2.

In the present embodiment, the voltage controlled oscillation circuit 10 outputs, to the fractional N-PLL circuit 20, the oscillation signal CK1 having amplitude (small amplitude) of the voltage Vreg1 which is lower than the power supply voltage Vcc supplied from the Vcc terminal. As mentioned above, since the oscillation signal CK1 has the small amplitude, it is possible to reduce energy required for transmission and reception of the oscillation signal CK1 between the voltage controlled oscillation circuit 10 and the fractional N-PLL circuit 20 and thus to reduce a noise level mixed into the voltage controlled oscillator 24.

Through the examination, it is possible to reduce phase noise or jitter of an output signal from the oscillator 1.

Correction of Central Frequency

In the oscillator 1 of the present embodiment, it is possible to correct a central frequency (an output frequency when the control voltage VC is a central voltage (=(VCmin+VCmax)/2)) of an output signal by using the function of the fractional N-PLL circuit 20.

Figure 7A:
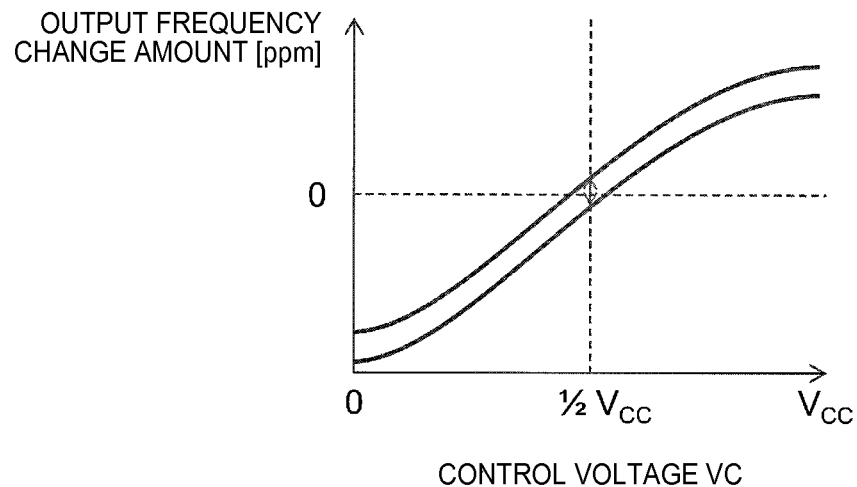
FIGS. 7A and 7B are diagrams illustrating that a central frequency can be corrected by the fractional N-PLL circuit.

FIG. 7A is a diagram illustrating an example of a relationship between the control voltage VC and an output frequency change amount in the oscillator 1 in a case where the fractional N-PLL circuit 20 is omitted at VCmin=0 V and VCmax=Vcc. Generally, a change amount of the central frequency (an output frequency at VC=Vcc/2) from a reference value (design value) varies in a range indicated by a two-headed arrow for each oscillator 1 in FIG. 7A due to individual differences between characteristics of the vibrators 3 or the voltage controlled oscillation circuits 10.

Figure 7B:
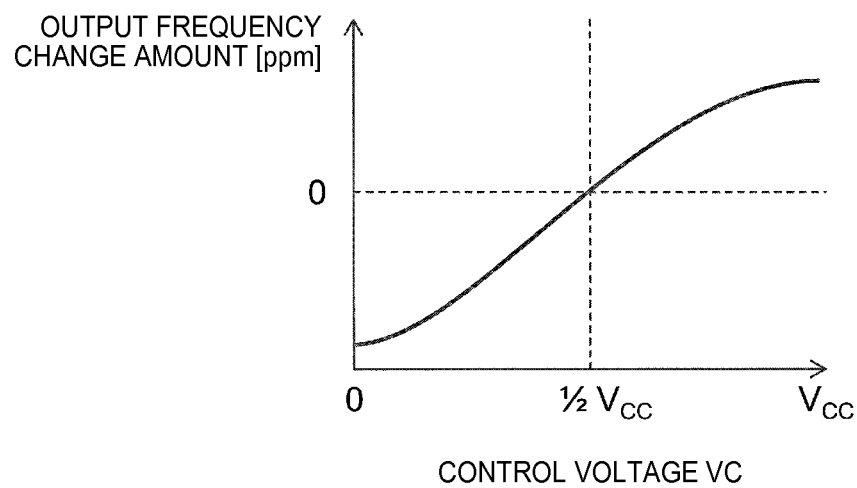

On the other hand, FIG. 7B is a diagram illustrating an example of a relationship between the control voltage VC and an output frequency change amount in the oscillator 1 in a case where the fractional N-PLL circuit 20 performs correction of the central frequency at VCmin=0 V and VCmax=Vcc. The fractional N-PLL circuit 20 can convert a frequency of the oscillation signal CK1 output from the voltage controlled oscillation circuit 10 at a high resolution on the basis of the integral division ratio N and the fractional division ratio F/M, and can thus correct a change amount (variance) of the central frequency from a reference value to substantially 0 ppm for each oscillator 1 as illustrated in FIG. 7B.

Extension of Frequency Variable Range

In the oscillator 1 of the present embodiment, it is possible to extend a variable range of an output frequency by using the function of the fractional N-PLL circuit 20.

Figure 8A:
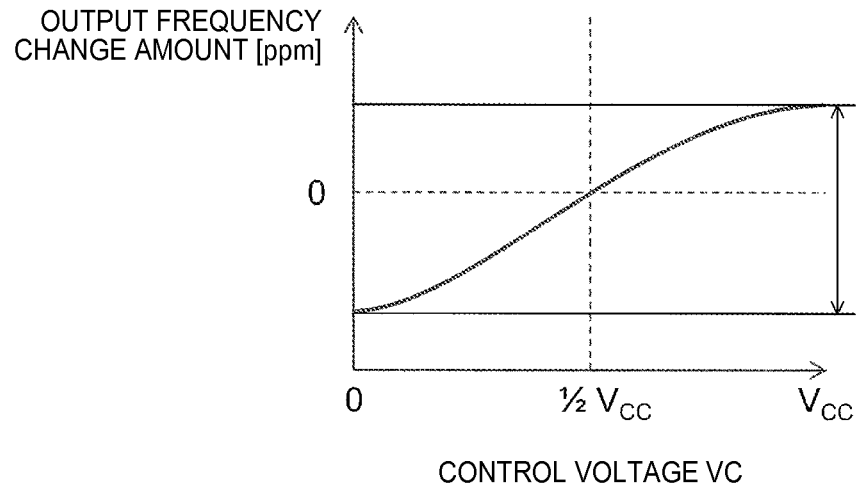
FIGS. 8A and 8B are diagrams illustrating that a frequency variable range can be extended by the fractional N-PLL circuit.

FIG. 8A is a diagram illustrating an example of a relationship between the control voltage VC and an output frequency change amount in the oscillator 1 in a case where the fractional N-PLL circuit 20 is omitted at VCmin=0 and VCmax=Vcc. A variable range of an output frequency is limited to, for example, a range indicated by a two-headed arrow in FIG. 8A due to characteristics of the vibrator 3, a capacitance value of the voltage controlled oscillation circuit 10, or the like.

Figure 8B:
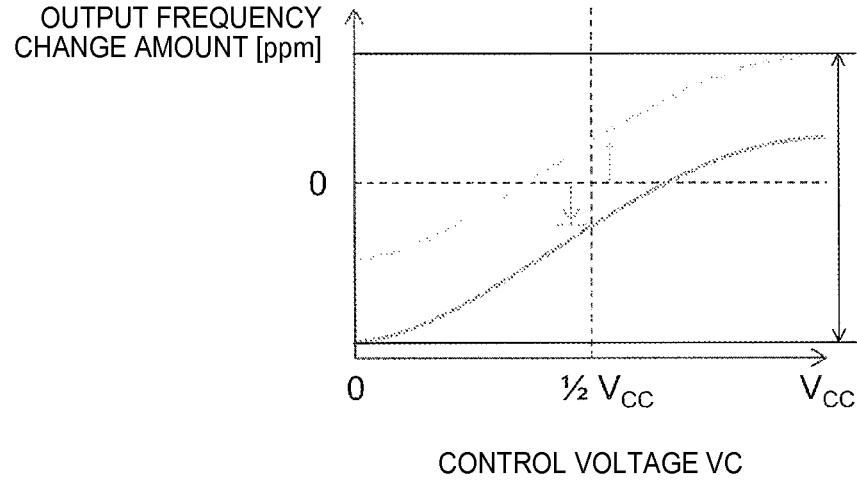

On the other hand, FIG. 8B is a diagram illustrating an example of a relationship between the control voltage VC and an output frequency change amount in the oscillator 1 in a case where the fractional N-PLL circuit 20 changes an output frequency at VCmin=0 V and VCmax=Vcc. The fractional N-PLL circuit 20 can convert a frequency of the oscillation signal CK1 output from the voltage controlled oscillation circuit 10 in a wide range on the basis of the integral division ratio N and the fractional division ratio F/M. Thus, as indicated by an upward arrow in FIG. 8B, the output frequency is increased by adding a positive offset to the central frequency, or, as indicated by a downward arrow, the output frequency is reduced by adding a negative offset to the central frequency. As a result, a variable range of the output frequency is extended in a range indicated by a two-headed arrow, for example.

Frequency Adjustment Method for Oscillator

In the oscillator 1 of the present embodiment, frequency adjustment methods for obtaining a desired output frequency may include, for example, the two following methods.

Frequency Adjustment Method 1:

An output frequency is roughly adjusted near a desired frequency by setting a division ratio of the fractional N-PLL circuit 20, and the output frequency is finely adjusted to the desired frequency by changing the control voltage VC. The method 1 is advantageous in miniaturization of the oscillator 1 since a setting resolution of a division ratio of the fractional N-PLL circuit 20 can be made low (the number of setting bits is small).

Frequency Adjustment Method 2:

An output frequency is roughly adjusted near a desired frequency by changing the control voltage VC, and the output frequency is finely adjusted to the desired frequency by setting a division ratio of the fractional N-PLL circuit 20. In the method 2, a setting resolution (the number of bits) of a division ratio of the fractional N-PLL circuit 20 is designed to be extremely high, and thus adjustment can be performed with extremely high accuracy.

Method for Reducing Fluctuation in Frequency at which Integer Boundary Spur Occurs Generally, when phase noise characteristics of an output signal from a fractional N-PLL circuit are measured in a desired range with a detuning frequency (offset frequency) as a horizontal axis, a signal having frequency components corresponding to differences between harmonics of integer multiples of a reference frequency and the output frequency appears as an integer boundary spur (IBS).

For example, in an oscillator (for example, the oscillator disclosed in JP-T-2006-526946) of the related art in which a fractional N-PLL circuit is provided in a rear stage of an SPXO, if an output frequency is changed by changing a division ratio of the fractional N-PLL circuit, a frequency also changes at which an integer boundary spur occurs. With reference to FIGS. 9A and 9B, a description will be made that a frequency changes at which an integer boundary spur occurs in a case where an output frequency is changed in the oscillator of the related art.

As illustrated in FIG. 9A, in a case where an output frequency is set to 400.00000 MHz by setting a division ratio to 3.9997 at a reference frequency of 100.00075 MHz, an integer boundary spur occurs at a detuning frequency of 30 kHz. In contrast, as illustrated in FIG. 9B, in a case where the division ratio is changed to 3.9999 so that an output frequency is changed by +50 ppm and is thus set to 400.02000 MHz, an integer boundary spur occurs at a detuning frequency of 10 kHz. In other words, if an output frequency is changed by +50 ppm, a frequency at which an integer boundary spur occurs is shifted by 20 kHz.

Figure 10:
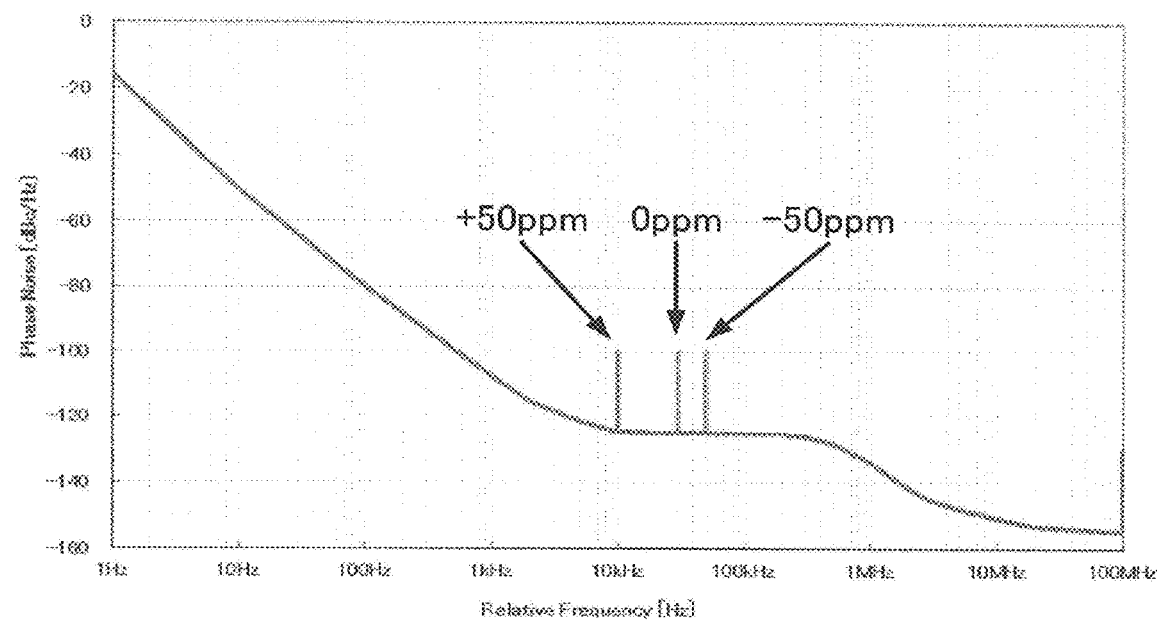
FIG. 10 is a diagram illustrating an example of an integer boundary spur occurring in the oscillator of the related art.

FIG. 10 illustrates an example of an integer boundary spur occurring in the oscillator of the related art. In FIG. 10, the horizontal axis expresses a detuning frequency (offset frequency), and the vertical axis expresses phase noise. FIG. 10 illustrates phase noise characteristics at an output frequency of 0 ppm, phase noise characteristics at an output frequency of +50 ppm, and phase noise characteristics at an output frequency of −50 ppm in an overlapping manner. An integer boundary spur at the output frequency of 0 ppm is the integer boundary spur described in FIG. 9A, and an integer boundary spur at the output frequency of +50 ppm is the integer boundary spur described in FIG. 9B. FIG. 10 also illustrates an integer boundary spur at the output frequency of −50 ppm. As illustrated in FIG. 10, in the oscillator of the related art, if an output frequency is changed, a frequency at which an integer boundary spur occurs considerably fluctuates.

As mentioned above, if a frequency fluctuates at which an integer boundary spur occurs, this is inconvenient for estimating performance of an oscillator. For example, in an optical network system in which optical communication is performed by modulating an output frequency of an oscillator, there are cases where performance of the oscillator is evaluated on the basis of a bit error rate. The bit error rate has a correlation with phase noise characteristics of an output signal of the oscillator. Thus, phase noise characteristics at 12 kHz to 20 MHz are important in a certain standard, and phase noise characteristics at 50 kHz to 80 MHz are important in another standard. A result of integrating phase noise across the frequency bandwidth is evaluated as jitter of an output signal of the oscillator, and the larger the amount of jitter, the higher the bit error rate. In the example described in FIG. 9A, an integer boundary spur occurs within a frequency bandwidth of 12 kHz to 10 MHz or 20 kHz to 80 MHz, but, in the example described in FIG. 9B, an integer boundary spur occurs in a bandwidth other than the frequency bandwidth. Therefore, an amount of jitter is larger in the example described in FIG. 9A, and thus a bit error rate increases. In other words, in a case where the oscillator of the related art is used, a bit error rate fluctuates each time an output frequency is changed, and thus it is difficult to accurately evaluate performance of the oscillator.

In contrast, in the oscillator 1 of the present embodiment, it is possible to reduce fluctuation in a frequency at which an integer boundary spur occurs by changing an output frequency through changing of the control voltage VC without changing setting regarding a division ratio of the fractional N-PLL circuit 20. With reference to FIGS. 11A and 11B, a description will be made that a frequency at which an integer boundary spur occurs scarcely changes in a case where an output frequency is changed in the oscillator 1 of the present embodiment.

As illustrated in FIG. 11A, in a case where an output frequency is set to 400.00000 MHz by setting a division ratio to 3.9997 at a reference frequency of 100.00075 MHz, an integer boundary spur occurs at a detuning frequency of 30 kHz. Setting regarding the reference frequency and the division ratio illustrated in FIG. 11A is the same as that in FIG. 9A. In contrast, as illustrated in FIG. 11B, in a case where an output frequency is changed by +50 ppm by changing the reference frequency to 100.0125 MHz through changing of the control voltage VC without changing the setting regarding the division ratio which is 3.997, and thus the output frequency is set to 400.02000 MHz, an integer boundary spur occurs at a detuning frequency of 30.00015 kHz. In other words, even if the output frequency is changed by +50 ppm, a frequency at which an integer boundary spur occurs is shifted only by 15 Hz.

Figure 12:
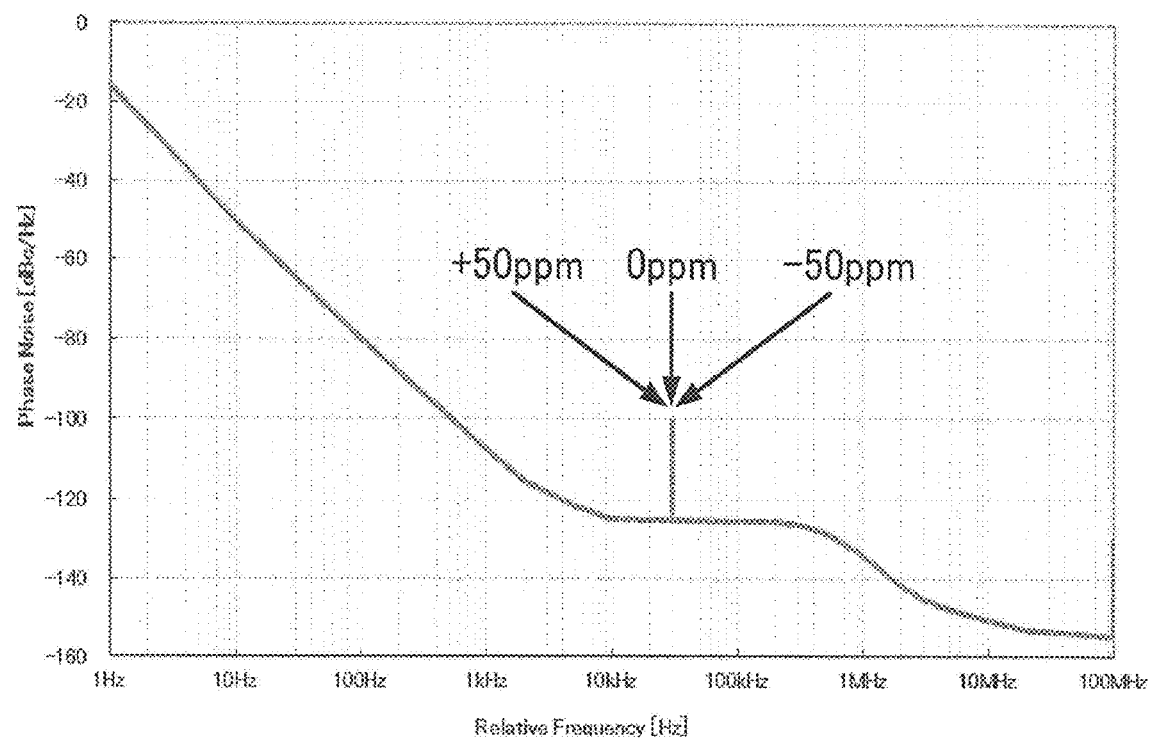
FIG. 12 is a diagram illustrating an example of an integer boundary spur occurring in the oscillator of the present embodiment.

FIG. 12 illustrates an example of an integer boundary spur occurring in the oscillator 1 of the present embodiment. In FIG. 12, the horizontal axis expresses a detuning frequency (offset frequency), and the vertical axis expresses phase noise. FIG. 12 illustrates phase noise characteristics at an output frequency of 0 ppm, phase noise characteristics at an output frequency of +50 ppm, and phase noise characteristics at an output frequency of −50 ppm in an overlapping manner. An integer boundary spur at the output frequency of 0 ppm is the integer boundary spur described in FIG. 11A, and an integer boundary spur at the output frequency of +50 ppm is the integer boundary spur described in FIG. 11B. FIG. 12 also illustrates an integer boundary spur at the output frequency of −50 ppm. As illustrated in FIG. 12, it can be seen that, in the oscillator 1 of the present embodiment, in a case where an output frequency is changed through changing of the control voltage VC without changing setting regarding a division ratio of the fractional N-PLL circuit 20, a frequency at which an integer boundary spur occurs scarcely changes.

Figure 13:
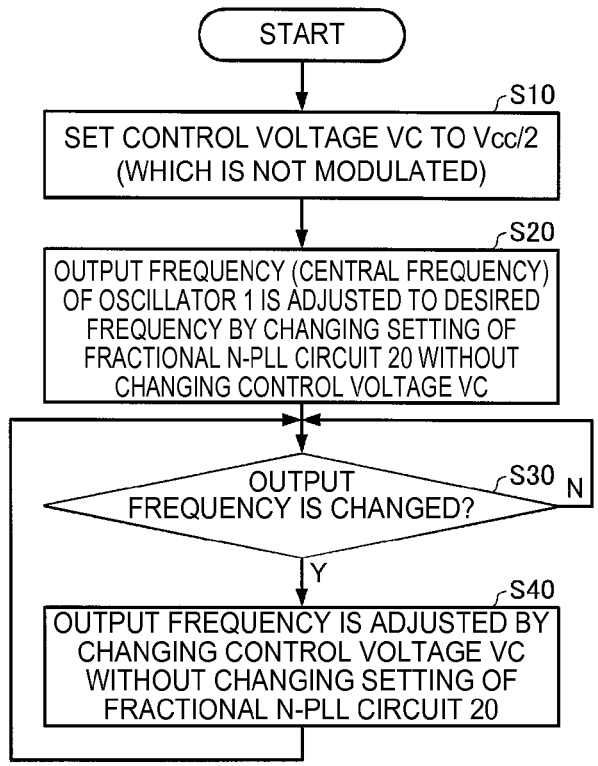
FIG. 13 is a flowchart illustrating an example of a frequency adjustment method for the oscillator of the present embodiment.

FIG. 13 is a flowchart illustrating an example of a frequency adjustment method for reducing fluctuation in a frequency at which an integer boundary spur occurs, included in a manufacturing method of the oscillator 1 of the present embodiment.

In the flowchart of FIG. 13, first, the control voltage VC is set to Vcc/2 (a voltage which is not modulated) (S10).

Next, an output frequency (central frequency) of the oscillator 1 is adjusted to a desired frequency by changing setting (setting regarding the integral division ratio N and the fractional division ratio F/M) of the fractional N-PLL circuit 20 without changing the control voltage VC (S20).

In a case where an output frequency of the oscillator 1 is changed (Y in S30), the output frequency is adjusted by changing the control voltage VC without changing the setting (the setting regarding the integral division ratio N and the fractional division ratio F/M) of the fractional N-PLL circuit 20 (S40). For example, in a case where an output frequency of the oscillator 1 is increased, the control voltage VC is increased, and in a case where an output frequency of the oscillator 1 is decreased, the control voltage VC is decreased.

In a case where an output frequency of the oscillator 1 is not changed (N in S30), neither the setting (the setting regarding the integral division ratio N and the fractional division ratio F/M) of the fractional N-PLL circuit 20 nor the control voltage VC are changed.

According to the flowchart, after a central frequency of the output frequency of the oscillator 1 is adjusted in step S10, the output frequency is adjusted by changing the control voltage VC without changing the setting of the fractional N-PLL circuit 20. Therefore, in the same manner as described in the examples of FIGS. 11A and 11B, even if the output frequency is changed, fluctuation in a frequency at which an integer boundary spur occurs is reduced.

As described above, according to the oscillator 1 of the present embodiment, a rough adjustment of an output frequency may be performed by the voltage controlled oscillation circuit 10, and a fine adjustment of the output frequency may be performed by the fractional N-PLL circuit 20. Alternatively, a rough adjustment of an output frequency may be performed by the fractional N-PLL circuit 20, and a fine adjustment of the output frequency may be performed by the voltage controlled oscillation circuit 10.

According to the oscillator 1 of the present embodiment, since a frequency of the oscillation signal CK1 which is output from the voltage controlled oscillation circuit 10 can be adjusted by the fractional N-PLL circuit 20 which is provided in the rear stage of the voltage controlled oscillation circuit 10, it is possible to correct a central frequency of an output frequency without physically processing the vibrator.

According to the oscillator 1 of the present embodiment, since an oscillation frequency of the voltage controlled oscillation circuit 10 is changed in tracking of a change of the control voltage VC, for example, if the control voltage VC is changed at a high speed without changing setting regarding a division ratio of the fractional N-PLL circuit 20, it is possible to change an output frequency at a high speed. Alternatively, since setting regarding a division ratio of the fractional N-PLL circuit 20 can be changed at a high speed via the digital interface (the setting can be changed without performing analog-digital conversion), it is possible to change an output frequency at a high speed.

According to the oscillator 1 of the present embodiment, in a case where an output frequency is changed by changing an oscillation frequency of the voltage controlled oscillation circuit 10 through changing of the control voltage VC without changing setting regarding a division ratio of the fractional N-PLL circuit 20, the setting regarding a division ratio of the fractional N-PLL circuit 20 is not changed. Thus, it is possible to reduce fluctuation in a frequency at which an integer boundary spur occurs.

2. Electronic Apparatus

Figure 14:
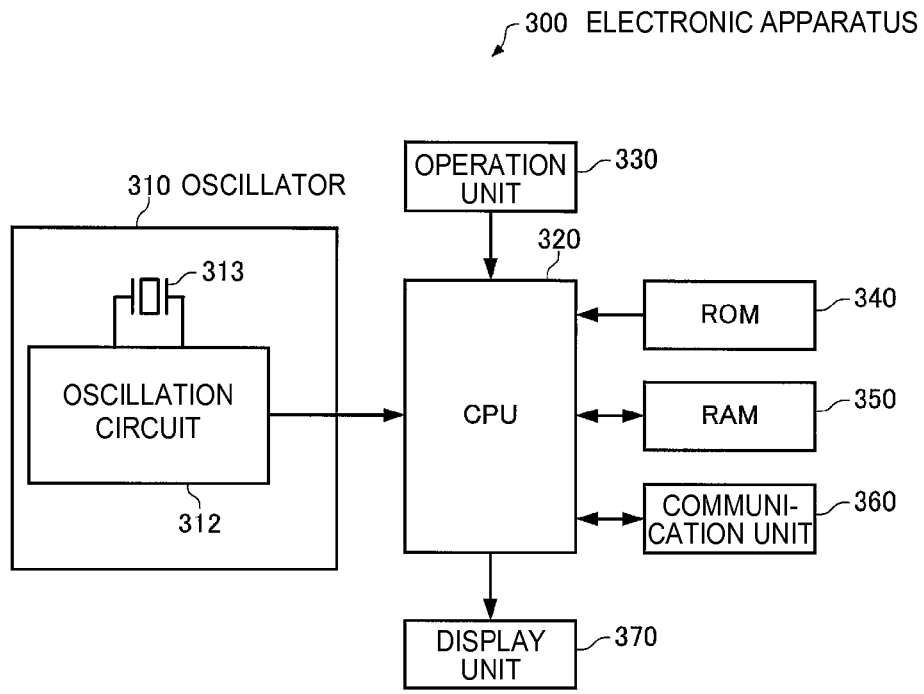
FIG. 14 is a functional block diagram of an electronic apparatus of the present embodiment.
Figure 15:
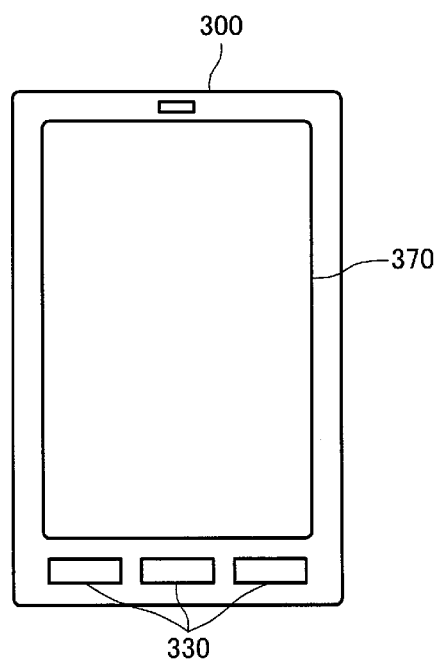
FIG. 15 is a diagram illustrating an example of an exterior of the electronic apparatus of the present embodiment.

FIG. 14 is a functional block diagram of an electronic apparatus of the present embodiment. FIG. 15 is a diagram illustrating an example of an exterior of a smart phone which is an example of the electronic apparatus of the present embodiment.

An electronic apparatus 300 of the present embodiment includes an oscillator 310, a central processing unit (CPU) 320, an operation unit 330, a read only memory (ROM) 340, a random access memory (RAM) 350, a communication unit 360, and a display unit 370. The electronic apparatus of the present embodiment may have a configuration in which some of the constituent elements (the respective units) of FIG. 14 may be omitted or changed, or other constituent elements may be added thereto.

The oscillator 310 includes an oscillation circuit 312 and a vibrator 313. The oscillation circuit 312 oscillates the vibrator 313 to generate an oscillation signal. The oscillator 310 outputs the oscillation signal to the CPU 320.

The CPU 320 performs various calculation processes or control processes by using the oscillation signal which is input from the oscillator 310 as a clock signal, according to a program stored in the ROM 340 or the like. Specifically, the CPU 320 performs various processes responding to operation signals from the operation unit 330, a process of controlling the communication unit 360 in order to perform data communication with external devices, a process of transmitting a display signal for displaying various information pieces on the display unit 370, and the like.

The operation unit 330 is an input device constituted by operation keys, button switches, or the like, and outputs an operation signal responding to a user's operation to the CPU 320.

The ROM 340 stores programs, data, or the like for the CPU 320 performing various calculation processes or control processes.

The RAM 350 is used as a work area of the CPU 320, and temporarily stores a program or data read from the ROM 340, data which is input from the operation unit 330, results of calculation which is performed by the CPU 320 according to various programs, and the like.

The communication unit 360 performs various controls for establishing data communication between the CPU 320 and external devices.

The display unit 370 is a display device constituted by a liquid crystal display (LCD) or the like, and displays various information pieces on the basis of a display signal which is input from the CPU 320. The display unit 370 may be provided with a touch panel which functions as the operation unit 330.

For example, the oscillation circuit 2 of the above-described embodiment is employed as the oscillation circuit 312, and, for example, the oscillator 1 of the above-described embodiment is employed as the oscillator 310. Thus, it is possible to implement an electronic apparatus with high usefulness or high reliability.

Such an electronic apparatus 300 may be various electronic apparatuses, and may be, for example, a communication apparatus (for example, an optical transmission apparatus), a personal computer (for example, a mobile type personal computer, a laptop type personal computer, or a tablet type personal computer), a mobile terminal such as a smart phone or a mobile phone, a digital camera, an ink jet type ejection apparatus (for example, an ink jet printer), a storage area network apparatus such as a router or a switch, a local area network apparatus, an apparatus for a mobile terminal base station, a television, a video camera, a video recorder, a car navigation apparatus, a real-time clock apparatus, a pager, an electronic organizer (including a communication function), an electronic dictionary, an electronic calculator, an electronic gaming machine, a game controller, a word processor, a workstation, a videophone, a security television monitor, an electronic binocular, a POS terminal, a medical apparatus (for example, an electronic thermometer, a sphygmomanometer, a blood glucose monitoring system, an electrocardiographic apparatus, an ultrasonic diagnostic apparatus, or an electronic endoscope), a fish-finder, various measurement apparatuses, meters and gauges (for example, meters and gauges of vehicles, aircrafts, and ships), a flight simulator, a head mounted display, a motion tracer, a motion tracker, a motion controller, and a pedestrian dead reckoning (PDR) apparatus.

3. Moving Object

Figure 16:
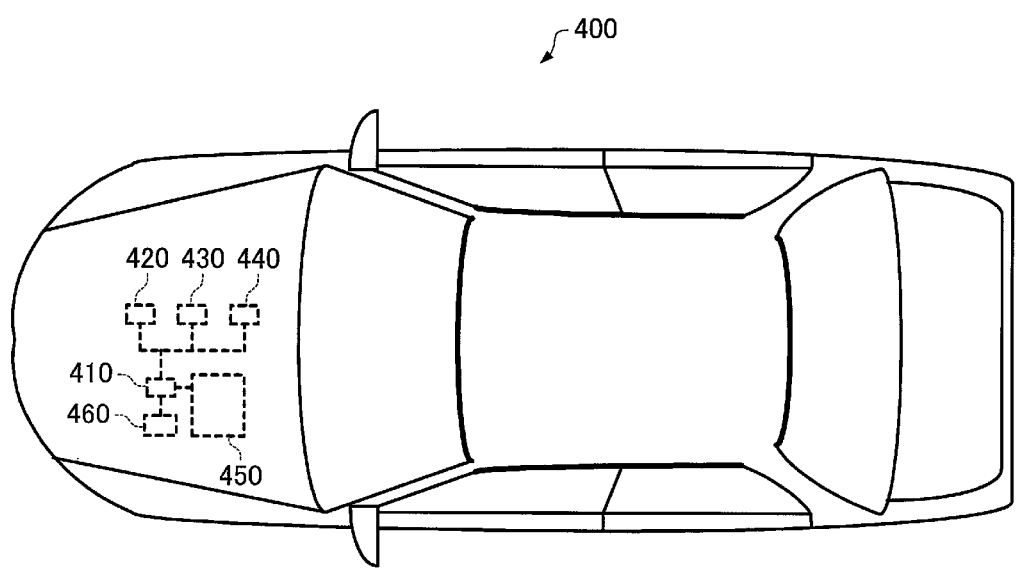
FIG. 16 is a diagram illustrating an example of a moving object of the present embodiment.

FIG. 16 is a view (top view) illustrating an example of a moving object of the present embodiment. A moving object 400 illustrated in FIG. 16 includes an oscillator 410, controllers 420, 430 and 440 which perform various controls on an engine system, a brake system, a keyless entry system, and the like, a battery 450, and a backup battery 460. The moving object of the present embodiment may have a configuration in which some of the constituent elements (the respective units) of FIG. 16 may be omitted, or other constituent elements may be added thereto.

The oscillator 410 includes an oscillation circuit and a vibrator (not illustrated), and the oscillation circuit oscillates the vibrator to generate an oscillation signal. The oscillation signal is output to the controllers 420, 430 and 440 from an external terminal of the oscillator 410, and is used as a clock signal, for example.

The battery 450 supplies power to the oscillator 410 and the controllers 420, 430 and 440. The backup battery 460 supplies power to the oscillator 410 and the controllers 420, 430 and 440 when an output voltage of the battery 450 becomes lower than a threshold value.

For example, the oscillation circuit 2 of the above-described embodiment is employed as the oscillation circuit of the oscillator 410, and, for example, the oscillator 1 of the above-described embodiment is employed as the oscillator 410. Thus, it is possible to implement a moving object with high usefulness or high reliability.

Such a moving object 400 may be various moving objects, and may be, for example, an automobile (also including an electric car), an aircraft such as a jet plane or a helicopter, a ship, a rocket, and an artificial satellite.

The invention is not limited to the present embodiment, and may have various modifications within the scope of the invention.

For example, in the above-described embodiments, an inter-multiple PLL circuit (integer PLL) may be used instead of the fractional N-PLL circuit 20. The oscillator 1 using the integer-multiple PLL circuit outputs the oscillation signal CK2 with a frequency of an integer multiple (N times) of a frequency of the oscillation signal CK1 in a state in which the integral division ratio N of the PLL circuit is fixed, and can change the oscillation signal CK2 in a frequency variable range which is N times as wide as that of the oscillation signal CK1 according to the control voltage VC. As mentioned above, the oscillator which uses the integer-multiple PLL circuit instead of the fractional N-PLL circuit 20 also achieves the same effect as in the oscillator 1 of the present embodiment. In the integer-multiple PLL circuit, a frequency at which an integer boundary spur occurs overlaps an output frequency, and thus an influence thereof is not great.

The above-described embodiments and modification examples are only examples, and the invention is not limited thereto. For example, the respective embodiments and the respective modification examples may be combined with each other as appropriate.

The invention includes substantially the same configuration (for example, a configuration in which functions, methods, and results are the same or a configuration in which objects and effects are the same) as the configuration described in the embodiments. The invention includes a configuration in which a part of the configuration described in the embodiments is replaced with another part. The invention includes a configuration which achieves the same operation and effect or a configuration capable of achieving the same object as in the configuration described in the embodiments. The invention includes a configuration in which a well-known technique is added to the configuration described in the embodiments.

The entire disclosure of Japanese Patent Application No. 2013-272733 filed Dec. 27, 2013 is expressly incorporated by reference herein.

What is claimed is:
1. An oscillation circuit comprising:
a voltage controlled oscillation circuit that controls a frequency of an oscillation signal based on an input voltage; and
a PLL circuit that receives the oscillation signal and includes an oscillator which controls an oscillation frequency based on control input data, wherein the oscillation signal is a signal with an amplitude smaller than that of a power supply voltage that is supplied to the oscillation circuit.

2. The oscillation circuit according to claim 1, wherein the PLL circuit is a fractional N-PLL circuit.

3. The oscillation circuit according to claim 1, wherein power supply voltages are supplied to the voltage controlled oscillation circuit and the oscillator of the PLL circuit from different power supplies.

4. The oscillation circuit according to claim 2, wherein power supply voltages are supplied to the voltage controlled oscillation circuit and the oscillator of the PLL circuit from different power supplies.

5. The oscillation circuit according to claim 1, wherein power supply voltages are supplied to the voltage controlled oscillation circuit and the oscillator of the PLL circuit from different power supplies.

6. An oscillator comprising:
the oscillation circuit according to claim 1; and
a vibrator that is oscillated by the voltage controlled oscillation circuit.

7. An oscillator comprising:
the oscillation circuit according to claim 2; and
a vibrator that is oscillated by the voltage controlled oscillation circuit.

8. An oscillator comprising:
the oscillation circuit according to claim 3; and
a vibrator that is oscillated by the voltage controlled oscillation circuit.

9. An electronic apparatus comprising the oscillation circuit according to claim 1.

10. An electronic apparatus comprising the oscillation circuit according to claim 2.

11. A moving object comprising the oscillation circuit according to claim 1.

12. A moving object comprising the oscillation circuit according to claim 2.

13. A frequency adjustment method of an oscillator which includes a vibrator; a voltage controlled oscillation circuit that includes a variable capacitance circuit provided with a variable capacitance element whose capacitance value is controlled based on an input voltage and oscillates the vibrator so as to generate an oscillation signal; and a PLL circuit that receives the oscillation signal and includes an oscillator which controls an oscillation frequency based on control input data, the method comprising:
adjusting a frequency of the oscillation signal by changing a setting of the PLL circuit; and
changing a capacitance value of the variable capacitance element by changing the input voltage without changing the setting of the PLL circuit so that the frequency of the oscillation circuit is adjusted.

14. The frequency adjustment method of the oscillator according to claim 13, wherein the setting of the PLL circuit is a setting regarding an integral division ratio and a fractional division ratio.

* * * * *